(12) United States Patent
Babaei et al.

(10) Patent No.: US 10,715,277 B2
(45) Date of Patent: *Jul. 14, 2020

(54) SYSTEMS AND METHODS FOR PROVIDING RESILIENCE TO LTE SIGNALING INTERFERENCE IN WIFI

(71) Applicant: CABLE TELEVISION LABORATORIES, INC., Louisville, CO (US)

(72) Inventors: Alireza Babaei, Herndon, VA (US); Jennifer Andreoli-Fang, Boulder, CO (US); Yimin Pang, Longmont, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/181,092

(22) Filed: Nov. 5, 2018

(65) Prior Publication Data

US 2019/0074927 A1 Mar. 7, 2019

Related U.S. Application Data

(63) Continuation of application No. 15/413,655, filed on Jan. 24, 2017, now Pat. No. 10,122,494, which is a (Continued)

(51) Int. Cl.
*H04L 1/00* (2006.01)
*H03M 13/35* (2006.01)
(Continued)

(52) U.S. Cl.
CPC .......... *H04L 1/007* (2013.01); *H03M 13/353* (2013.01); *H04J 3/0647* (2013.01); *H04J 3/1694* (2013.01);
(Continued)

(58) Field of Classification Search
CPC .. H03M 13/353; H04L 1/0041; H04L 1/0009; H04L 5/0092; G06F 11/0709;
(Continued)

(56) References Cited

U.S. PATENT DOCUMENTS 5,517,522 A * 5/1996 Arweiler ................. H04L 43/50
375/224
5,828,677 A 10/1998 Sayeed et al.
(Continued)

OTHER PUBLICATIONS

Hu et al. "Interference avoidance for in-device coexistence in 3GPP LTE-advanced: challenges and solutions," IEEE, pp. 60-67, 2012.

*Primary Examiner* — Guy J Lamarre
(74) *Attorney, Agent, or Firm* — Lathrop GPM LLP

(57) ABSTRACT

Systems and methods presented herein enhance WiFi communications in a RF band where conflicting LTE signaling exists. In one embodiment, a system includes a processor operable to detect the WiFi communications between a UE and a wireless access point of a WiFi network, to identify errors in the WiFi communications, and to determine a periodicity of the errors based on the LTE signaling structure. The system also includes an encoder communicatively coupled to the processor and operable to encode the WiFi communications with error correction, and to change the error correction based on the periodicity of the errors in the WiFi communications.

21 Claims, 11 Drawing Sheets

Related U.S. Application Data continuation of application No. 14/531,066, filed on Nov. 3, 2014, now Pat. No. 9,559,728.

(51) Int. Cl.

| | | |
|---|---|---|
| *H04L 27/00* | (2006.01) | |
| *H04J 3/06* | (2006.01) | |
| *H04J 3/16* | (2006.01) | |
| *H04L 5/00* | (2006.01) | |
| *H04W 72/04* | (2009.01) | |
| *H04W 72/08* | (2009.01) | |
| *H04W 84/12* | (2009.01) | |
| *H04W 76/10* | (2018.01) | |

(52) U.S. Cl.
CPC .......... *H04L 1/0009* (2013.01); *H04L 1/0011* (2013.01); *H04L 1/0041* (2013.01); *H04L 1/0045* (2013.01); *H04L 5/0092* (2013.01); *H04L 27/0006* (2013.01); *H04W 72/0406* (2013.01); *H04W 72/0446* (2013.01); *H04W 72/082* (2013.01); *H04W 76/10* (2018.02); *H04W 84/12* (2013.01)

(58) Field of Classification Search
CPC . G06F 11/076; H04W 84/12; H04W 72/0446; H04W 72/0406; H04W 72/082; H04J 3/1694; H04J 3/0647
See application file for complete search history.

(56) References Cited

U.S. PATENT DOCUMENTS

| | | | |
|---|---|---|---|
| 6,731,694 B2* | 5/2004 | Bozeki | H04L 27/368 330/107 |
| 6,754,506 B2* | 6/2004 | Chang | H04W 52/12 455/245.1 |
| 7,907,512 B1 | 3/2011 | Embse | |
| 9,559,728 B2 | 1/2017 | Babaei et al. | |
| 10,122,494 B2 | 11/2018 | Babaei et al. | |
| 2003/0135794 A1 | 7/2003 | Longwell et al. | |
| 2005/0036727 A1* | 2/2005 | Wijngaarden | H04B 10/2569 385/11 |
| 2006/0112237 A1 | 5/2006 | Chen et al. | |
| 2008/0102880 A1 | 5/2008 | Gholmieh et al. | |
| 2008/0187059 A1 | 8/2008 | Sood | |
| 2008/0317162 A1 | 12/2008 | Roh et al. | |
| 2009/0268692 A1* | 10/2009 | Haartsen | H04B 1/7107 370/335 |
| 2010/0069080 A1 | 3/2010 | Benveniste | |
| 2010/0210214 A1* | 8/2010 | Pawar | H04W 72/082 455/63.1 |
| 2010/0304779 A1* | 12/2010 | Andrews | H04W 52/12 455/522 |
| 2011/0150505 A1 | 6/2011 | Roberts et al. | |
| 2011/0246862 A1 | 10/2011 | Graef | |
| 2012/0033645 A1 | 2/2012 | Mantravadi et al. | |
| 2012/0164948 A1 | 6/2012 | Narasimha et al. | |
| 2012/0213116 A1 | 8/2012 | Koo et al. | |
| 2013/0028201 A1 | 1/2013 | Koo et al. | |
| 2013/0148638 A1 | 6/2013 | Xing et al. | |
| 2013/0208587 A1 | 8/2013 | Bala et al. | |
| 2013/0272260 A1 | 10/2013 | Bitran et al. | |
| 2014/0115279 A1 | 4/2014 | Chirca et al. | |
| 2014/0161021 A1 | 6/2014 | Goldhamer | |
| 2015/0085683 A1 | 3/2015 | Sadek et al. | |
| 2015/0163767 A1 | 6/2015 | Shaw et al. | |
| 2015/0245365 A1 | 8/2015 | Isokangas et al. | |
| 2015/0270925 A1* | 9/2015 | Lin | H04L 1/0015 370/329 |

\* cited by examiner

SYSTEMS AND METHODS FOR PROVIDING RESILIENCE TO LTE SIGNALING INTERFERENCE IN WIFI

CROSS REFERENCE TO RELATED APPLICATIONS

This patent application is a continuation of U.S. patent application Ser. No. 15/413,655 (filed Jan. 24, 2017, now U.S. Pat. No. 10,122,494), which application is a continuation of U.S. patent application Ser. No. 14/531,066 (filed Nov. 3, 2014, now U.S. Pat. No. 9,559,728), which application claims priority to U.S. Provisional Patent Application No. 62/030,443 (filed Jul. 29, 2014), the entire contents of each of which are hereby incorporated by reference.

BACKGROUND

Long Term Evolution (LTE) wireless communications presently operate in certain licensed bands of the Radio Frequency (RF) spectrum so as to avoid conflicts with other wireless communication systems. However, LTE can operate in virtually any portion of the RF spectrum, including certain unlicensed portions of the spectrum where WiFi communication systems operate. Due to the nature of its MAC and PHY layers, LTE poses challenges to coexistence with other radio access technologies, such as WiFi. For example, WiFi is designed to coexist with other technologies via channel sensing and random backoff. But, LTE downlink channels are designed to continuously operate at a predefined power level decided by the operator's coverage requirements, regardless of where user equipment (UE) being served is actually located. Any LTE system operating in the same band as a WiFi system would interfere with the WiFi system because the WiFi system would have little chance to sense a clear channel and deem it suitable for transmission. Even assuming that LTE data transmissions could be configured to provide opportunities for WiFi transmissions in the same band, LTE systems periodically transmit reference symbols that can interfere with WiFi signaling.

SUMMARY

Systems and methods presented herein enhance WiFi communications in a RF band where conflicting LTE signaling exists. In one embodiment, a system includes a processor operable to detect the WiFi communications between a UE and a wireless access point (WAP) of a WiFi network, to identify errors in the WiFi communications, and to determine a periodicity of the errors based on the LTE signaling structure. The system also includes an encoder communicatively coupled to the processor and operable to encode the WiFi communications with error correction, and to change the error correction based on the periodicity of the errors in the WiFi communications.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
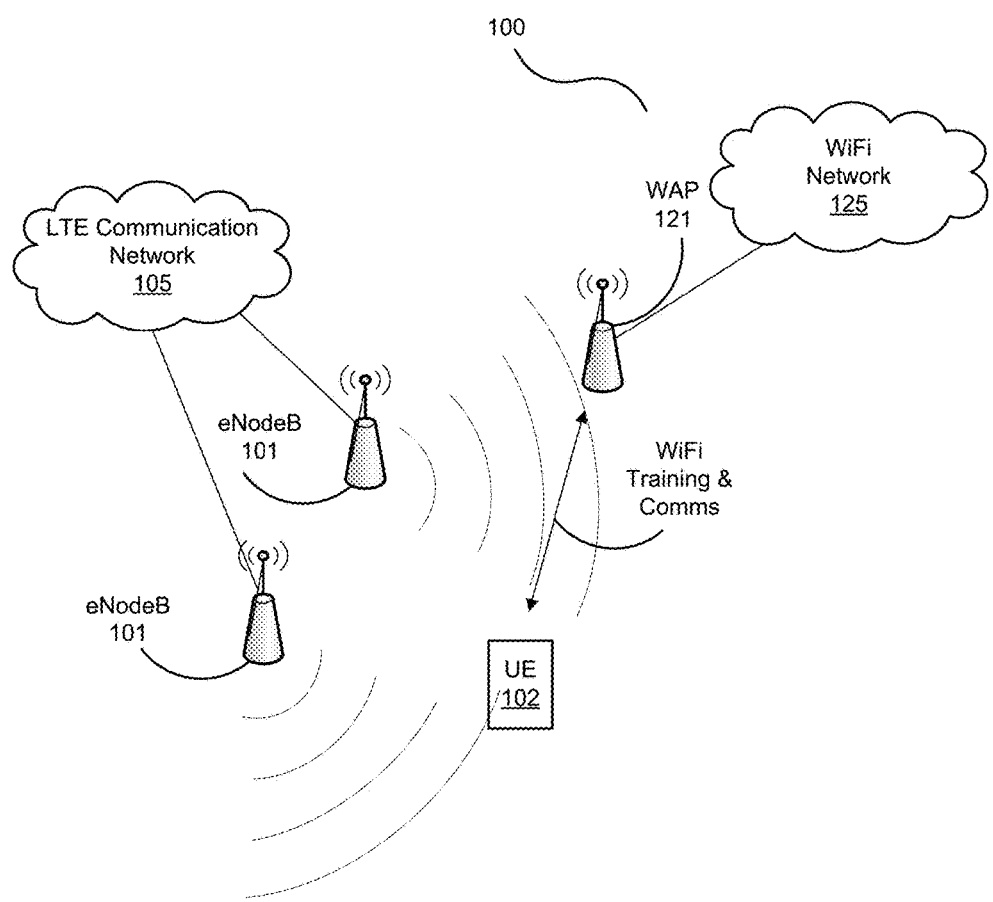
FIG. 1 is a block diagram of an exemplary WiFi system operable to coexist with LTE signaling.

FIG. 1 is a block diagram of an exemplary WiFi system 100 operable to coexist with LTE signaling. For example, an LTE communication network 105 may comprise a plurality of eNodeBs 101 operating in an RF band with other wireless communication networks, such as the WiFi network 125. Generally, when the eNodeBs 101 are operational, they reserve a chunk of the RF spectrum by continually transmitting LTE signaling, without regard to whether a UE requires LTE service. In some instances, the eNodeBs 101 may even transmit LTE signaling that does not persistently reserve the RF spectrum. However, certain reference signals of LTE signaling are periodically transmitted and can interrupt other forms of communication.

In this embodiment, the WiFi system 100 comprises a WiFi network 125 and one or more wireless access points (WAPs) 121 that are operable to provide resiliency to the interference associated with LTE signaling. In doing so, a WAP 121 may be operable to provide error correction in the WiFi communications with a UE 102 that changes based on the LTE signaling of the LTE communication network 105. Accordingly, the WiFi network 125 and the WAP 121 are any components, systems, devices, software, or combinations thereof operable to improve WiFi communications in an environment where there is also LTE signaling.

Alternatively or additionally, the UE 102 may also be operable to improve its WiFi communications with the WAP 121 by changing error correction in its WiFi communications with the WAP 121. Examples of the UE 102 include cell phones, tablet computers, laptop computers, and the like.

Figure 2:
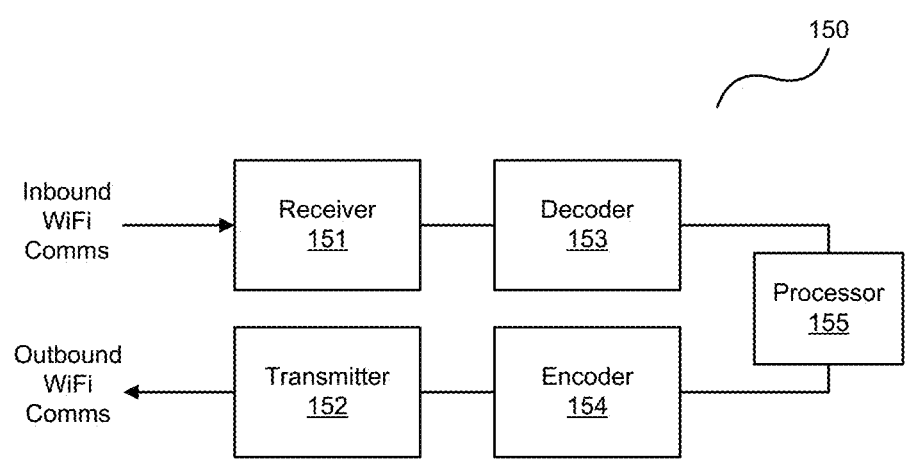
FIG. 2 is a block diagram of an exemplary module operable within a wireless access point and/or a UE in the WiFi system of FIG. 1.

FIG. 2 is a block diagram of an exemplary module 150 operable within a WAP 121 and/or a UE 102 in the WiFi system 100. For example, the WAP 121 and the UE 102 are configured with receivers and transmitters that are operable to perform WiFi training to establish WiFi communications between one another. In this regard, the module 150 comprises a WiFi receiver 151 and a WiFi transmitter 152 that is operable to perform WiFi training and establish WiFi communications between the WAP 121 and the UE 102. Differing from typical WiFi embodiments, however, are the decoder 153, the encoder 154, and the processor 155.

WiFi networks, like many communication systems, use error correction to overcome errors incurred during over the air transmission. The processor 155 in this embodiment, however, is operable to detect errors from inbound WiFi communications and subsequently adjust the error correction of the encoder 154 based on a priori knowledge of LTE signaling. For example, when the LTE communication network 105 is operable within the same RF band as the WiFi network 125, the LTE signaling transmits periodic reference signals across the portion of the RF spectrum in which it is operating. Based in part on knowledge of when those reference signals are transmitted in the LTE signaling, the processor 155 can increase the error correction capability of the WiFi communications to overcome the increased number of errors during LTE reference signal transmission.

Figure 3:
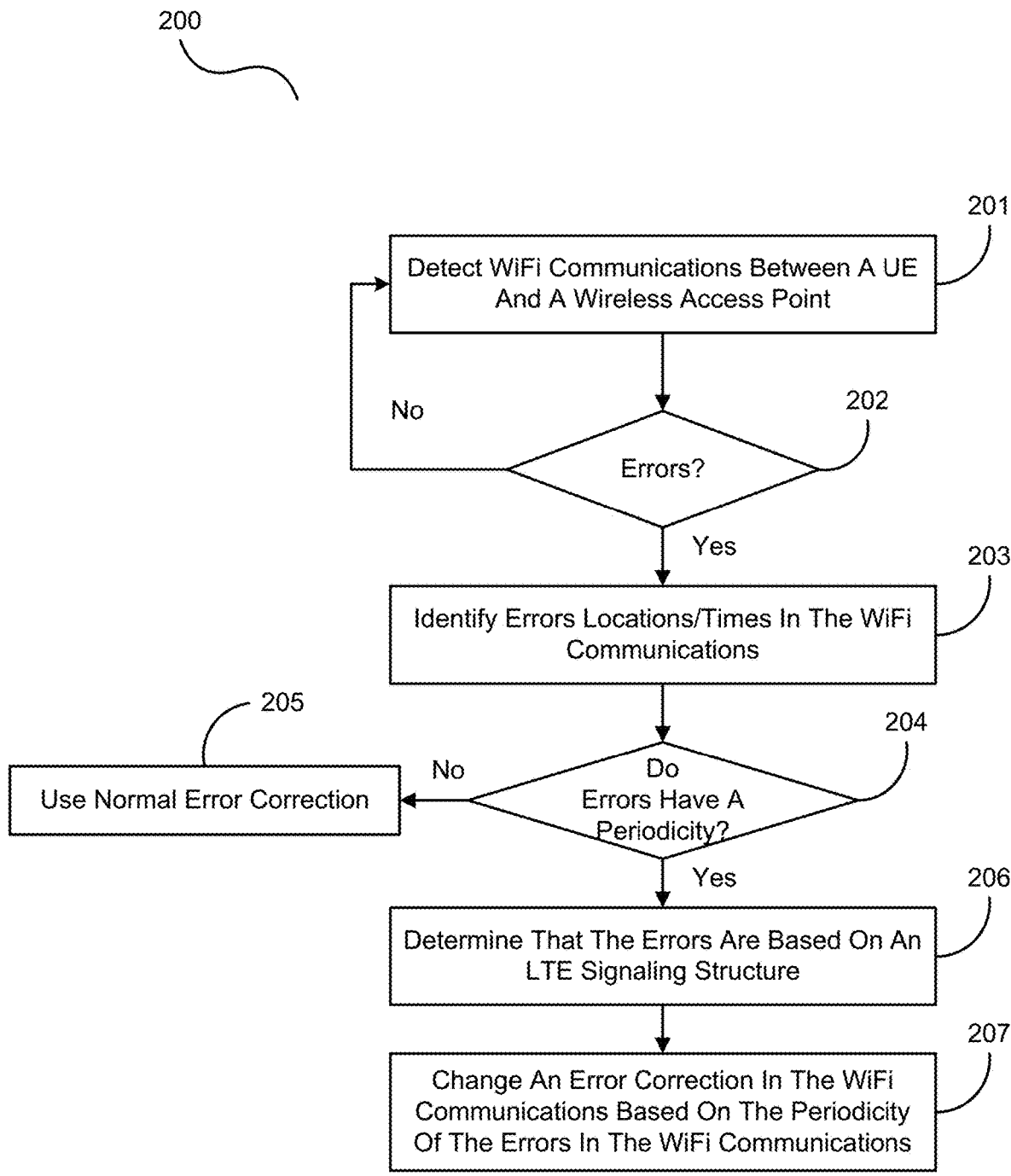
FIG. 3 is a flowchart illustrating an exemplary process of the WiFi system.

FIG. 3 is a flowchart illustrating an exemplary process 200 of the WiFi system 100, and more specifically the communication module 150 operable within the UE 102 and/or the WAP 121. The process 200 discloses the change in error correction encoding of WiFi communications by the communication module 150 in response to interfering LTE signaling. Generally, the process 200 initiates when WiFi training begins between the WAP 121 and the UE 102. For example, to establish a communication session between the UE 102 and the WiFi network 125, the communication modules 150 of the UE 102 and the WAP 121 train with one another to ensure that communications between the two are synchronized.

During training, there are usually message exchanges between the UE 102 and the WAP 121 that are acknowledged by one another. For example, the WAP 121 may send a message to the UE 102 over a WiFi channel to which the UE 102 responds. Once received and verified by the WAP 121, the WAP 121 may then reserve the channel for that particular UE 102. In this regard, the communication module 150 may be configured with the WAP 121 and/or the UE 102 to detect WiFi communications between the UE 102 and the WAP 121, in the process element 201.

To illustrate, when the WAP 121 trains with the UE 102 and sends messages that are to be acknowledged by the UE 102, the WAP 121 may detect those acknowledgment messages as part of a feedback mechanism for establishing a communication link between the WAP 121 and the UE 102. In doing so, the communication module 150 of the WAP 121 may determine if there are errors in the received messages from the UE 102, in the process element 202. In other words, before the WAP 121 can secure the WiFi channel for the UE 102, the WAP 121 expects to receive certain data in response to its messages sent to the UE 102. When the data received from the UE 102 is not what was expected, the WAP 121 may determine that the channel has been interfered with by LTE signaling of the LTE communication network 105.

From there, the communication module 150 of the WAP 121 may identify the error locations (e.g., times) in the WiFi communications, in the process element 203. Then, the communication module 150 determines whether a periodicity of the errors exists, in the process element 204, so as to determine whether the errors are result of LTE signaling in the same RF band as the WiFi communications of the WAP 121. In other words, the communication module 100 determines that the periodicity of the errors is based on the periodicity of certain signaling (e.g., reference signals) in the LTE signaling structure, in the process element 206. If no periodicity exists, then the errors are likely those to be incurred during typical WiFi communications that can be countered with normal error correction, in the process element 205.

Then, based on the determined periodicity of the errors, the processor 155 directs the encoder 154 to change the error correction of the WiFi communications, in the process element 207. For example, since the processor 155 has determined that the errors in the WiFi communications are the result of LTE signaling, the processor 155 can reasonably expect when the next error is to occur based on the LTE signaling structure. And with this a priori knowledge of an impending error, the processor 155 can direct the encoder 154 to increase its error correction capabilities by adding more forward error correction bits to overcome that error. Afterwards, the error correction can be lowered when no errors are expected.

Figure 4:
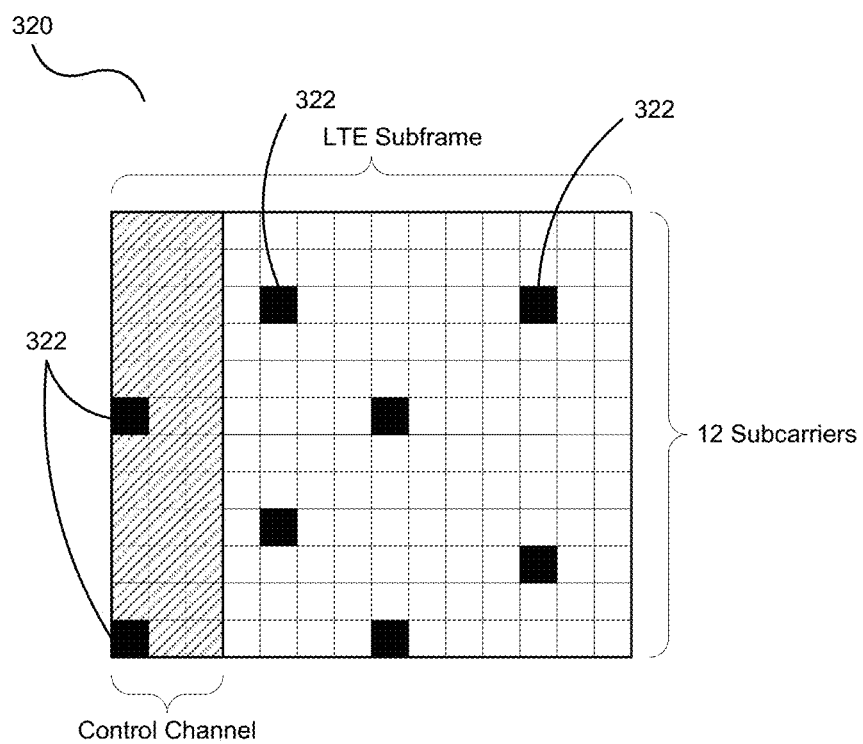
FIGS. 4-6 are block diagrams illustrating exemplary control channels of the LTE wireless telecommunications system.
Figure 5:
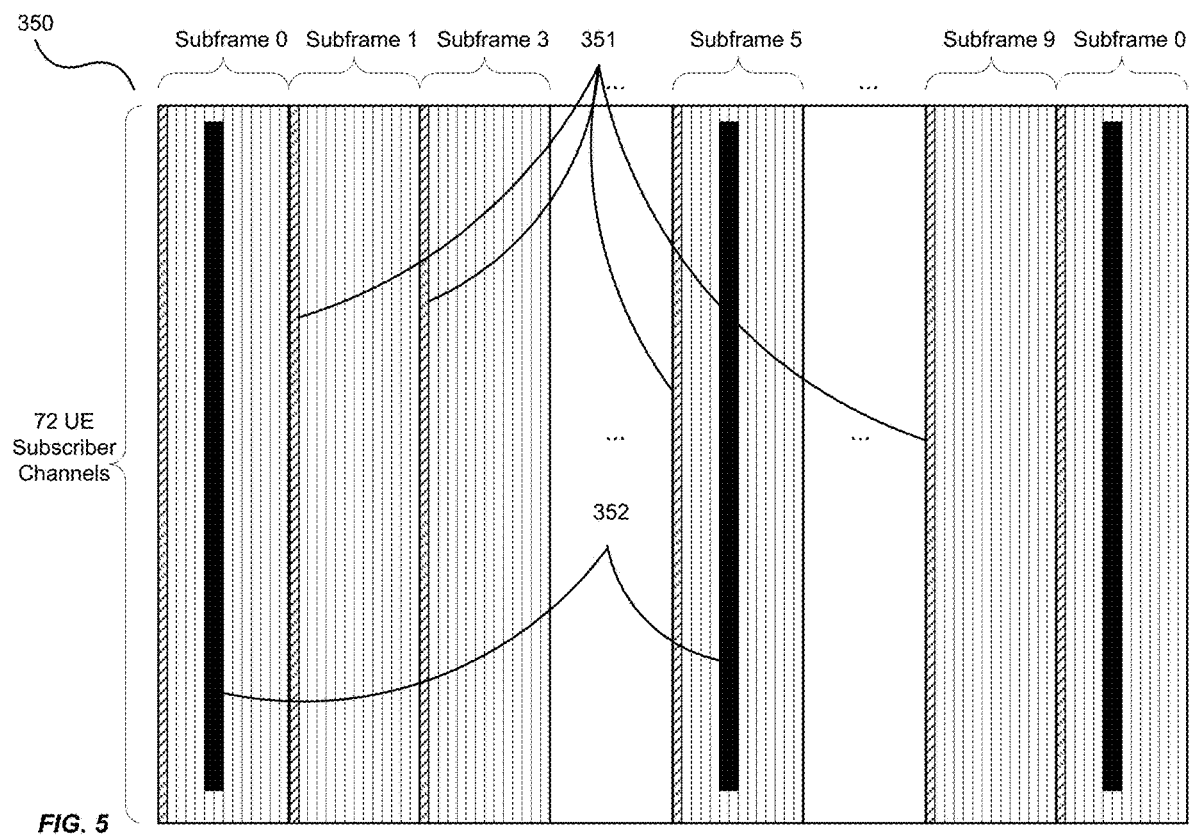
Figure 6:
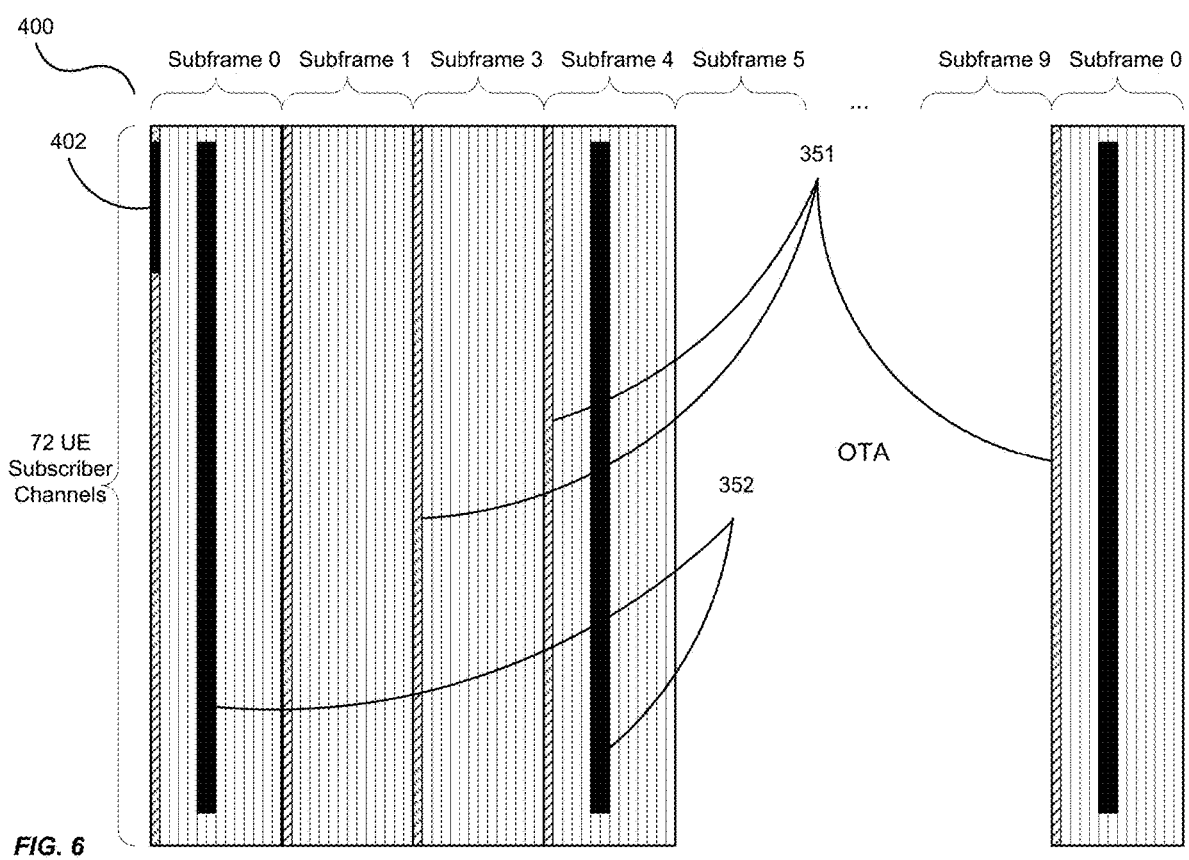

Some examples of LTE frames that may cause interference in WiFi communications when operating in the same band are illustrated in FIGS. 4-6. First, a background discussion is presented. In LTE, a Physical Downlink Control Channel (PDCCH) carries downlink allocation information and uplink allocation grants for a terminal. And, a Downlink Shared Channel (DL-SCH) carries Primary Synchronization Signals (PSS) and Secondary Synchronization Signals (SSS) for the UEs to discover an LTE cell. The DL-SCH elements are generally configured at the center of a channel and a Master Information Block (MIB) is transmitted therefrom. For example, in order to communicate with a network, a UE obtains basic system information, which is carried by the MIB (static) and a System Information Block (dynamic; "SIB"). The MIB carries the system information including system bandwidth, System Frame Number (SFN), and a Physical Hybrid Automatic Repeat Request (PHARM) Indicator Channel Configuration, or PHICH.

The MIB is carried on a Broadcast Channel (BCH) and mapped into a Physical Broadcast Channel (PBCH), which is transmitted with a fixed coding and modulation scheme that can be decoded after an initial cell search procedure. With the information obtained from the MIB, UEs can decode a Control Format Indicator (CFI), which indicates the PDCCH length and allows the PDCCH to be decoded. The presence, in the PDCCH, of a Downlink Control Information (DCI) message scrambled with System Information Radio Network Temporary Identifier (SI-RNTI) indicates that an SIB is carried in the same subframe.

The SIB is transmitted in the Broadcast Control Channel (BCCH) logical channel and BCCH messages are generally carried and transmitted on the DL-SCH. Control signaling is used to support the transmission of the DL-SCH. Control information for UEs is generally contained in a DCI message transmitted through the PDCCH. The number of MNOs (again, "Mobile Network Operators"), the allocation percentage per MNO, and the expected variation in allocation generally determine optimal locations for the center of each DL-SCH, thereby limiting the probability of DL-SCH relocations.

Generally, MIBs and SIB s are sent periodically to provide a UE with basic system information such as bandwidth, control channel configuration, etc. Typically, the MIB is sent at the six middle RBs every frame, or every 1 millisecond. And the "SIB 1" is repeated every eight frames, or every 8 ms, while other SIB s are scheduled periodically.

When employing TDD in an LTE network, time coordination is used between the eNodeBs in the LTE network, including coarse time coordination, fine time coordination, and synchronized time coordination. Coarse time coordination means that at least two eNodeBs share a clock with resolution greater than a clock pulse. Fine time coordination indicates that at least two eNodeBs share a clock with resolution less than the length of a cyclic prefix. Synchronized time coordination means that sample clocks are locked between the two eNodeBs.

When employing FDD in an LTE network, frequency coordination is used to between the eNodeBs in the LTE network. Generally, frequency coordination and allocation is semi-static, real time, and/or dynamic. Semi-static spectrum allocation means that spectrum allocation is provisioned by MNO agreements and changes infrequently. Real-time spectrum allocation means that spectrum allocation between MNOs that can vary dynamically based on resource needs and scheduler capability. Allocations are flexible within bounds that are configured by agreement between MNOs. Dynamic scheduling means channel time allocations that are variably sized for each MNO.

Generally, in LTE DLs, two synchronization signals are transmitted in six center Resource Blocks (RBs), including a Primary Sync Signal (PSS) and a Secondary Synchronization Signal (SSS). Information about system bandwidth is contained in the MIB and is expressed as some number of kHz above or below the center frequency. When a UE initially comes online, it finds the PSS/SSS and then the MIB.

With this in mind, an exemplary LTE subframe 320 is illustrated in FIG. 4 to show that certain reference signals can be moved about within the LTE frame when there are fewer LTE subscriber UEs. Cell-Specific Reference Signals (CSRSs) 322 are sent throughout the LTE downlink grid of LTE frames, in both time and frequency, in each subframe of each LTE frame. The CSRSs 322 are used for channel estimation for coherent detection by the UEs. The CSRSs 322 are transmitted regardless of the presence of downlink data traffic. Other reference signals are UE specific and are only sent on the resource blocks scheduled for particular UE. In certain scenarios, where time and frequency synchronization requirements are not highly stringent, subframes can be configured with lower density reference signal patterns (e.g., in low noise environments, low mobility environments, etc.). Still, these reference signals are periodically sent and can disrupt other communication systems like WiFi.

In FIGS. 5 and 6, LTE frames are illustrated to show how they might be reconfigured to accommodate WiFi signaling. For example, a traditional LTE frame 350 is illustrated in FIG. 5 as having 72 UE subscriber channels with 10 subframes in each LTE frame (labeled subframes 0-9 with each subframe being 1 ms in duration for a total of 10 ms). The LTE frame 350, when traditionally configured, occupies the RF band even when there is no data transmit and maintains its synchronization by transmitting a synchronization message every 5 ms (e.g., synchronization message 352 in the subframes 0 and 5). So, traditional LTE signaling blocks opportunities for WiFi even when LTE networks have no data to transmit.

To provide opportunities for WiFi communications in RF bands where LTE signaling occurs, the control channel 351 is transmitted with each subframe of an LTE frame, as illustrated with the LTE frame 400 in FIG. 6. By incorporating a frame structure message 402 in the control channel 351 in the LTE frame 400, UEs 102 can determine the characteristics of the LTE frame 400. For example, given certain levels of clock stability and other synchronization capabilities, it is possible to transmit to LTE frames without synchronization signals. By configuring the frame structure message 402 in the control channel 402 of a subframe, a UE 102 can determine how the LTE frame 400 is configured without the use of the synchronization signals. Thus, the synchronization signals of subframes 0 and 5 can be eliminated. And, since the subframes are no longer needed for synchronization, they can be removed during periods of low usage resulting in a burst transmissions of necessary subframes (e.g., subframes 0-4) to support UE communications.

In any case, the LTE signaling still transmits references signals that interfere with WiFi communications. Accordingly, embodiments herein provide a means for overcoming the inherent interference associated with LTE signaling, even when LTE signals are configured to cooperate with other communication systems/networks.

Figure 7:
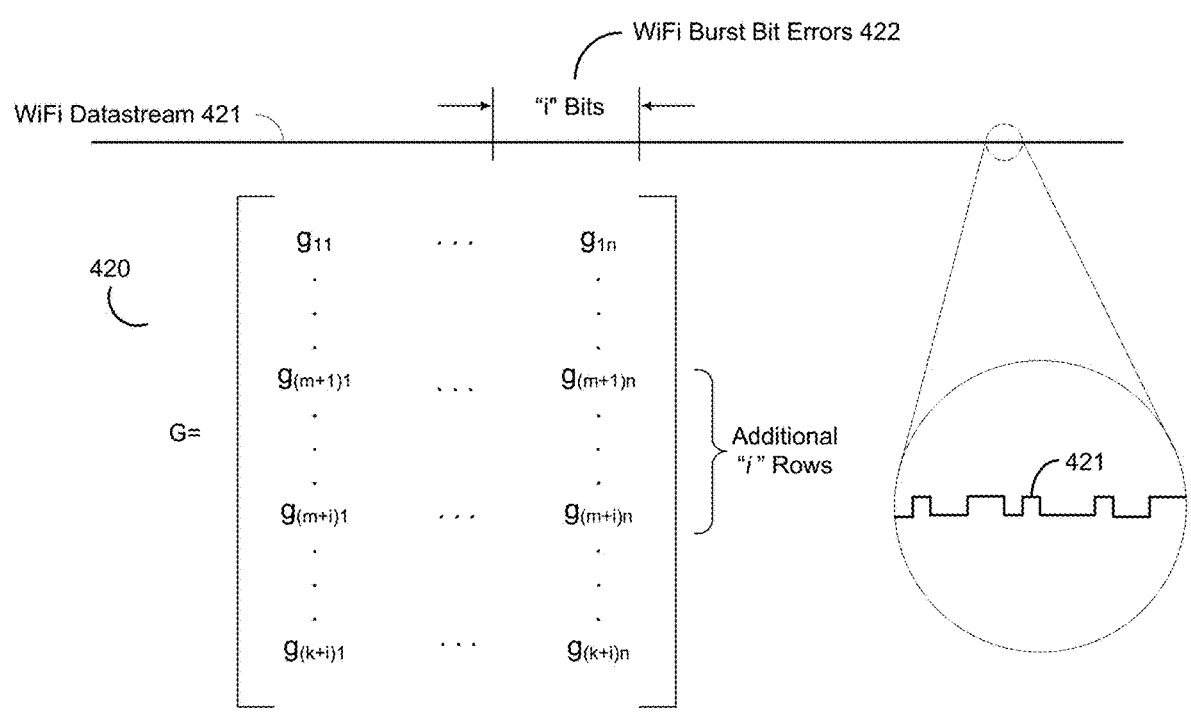
FIGS. 7-10 illustrate exemplary ways to implement error correction during WiFi communications.

In one embodiment illustrated in FIG. 7, the encoder 154 generates a matrix 420 of WiFi communications bits that includes "dummy" coded bits mapped onto the "windows" 422 of time where burst errors are likely to occur in the WiFi datastream 421 (i.e., based on the LTE signaling structures). And, when the dummy bits are transmitted by the WAP 121 and received by the UE 102, the decoder 153 ignores these bits allowing the decoder to bypass the error. Again, this process can be performed with the dummy bits being transmitted by the UE 102 and received by the WAP 121.

Generally, the encoder 154 adds as many rows as the number of dummy bits to the Forward Error Correction (FEC) generator matrix 420. Assuming that a window of time 422 corresponding to the burst errors lasts for as many as "i" bits, additional "i" rows can be added to the generator matrix 420 (e.g., for a (n, k) linear code and with i dummy bits, row 1 corresponding to the elements $g_{11}$ to $g_{1n}$, through row (k+i) corresponding to the elements $g_{(k+i)1}$ to $g_{(k+i)n}$). The "i" coded bits corresponding to the "i" rows are ignored during the decoding process when received. If the FEC is capable of correcting "j" burst bit errors (where j<i), then instead of "i" dummy bits, (j−i) dummy bits can be used. The references i, j, k, and n are merely representative of integers greater than "1" and not necessarily equal to any other similar references herein).

Figure 8:
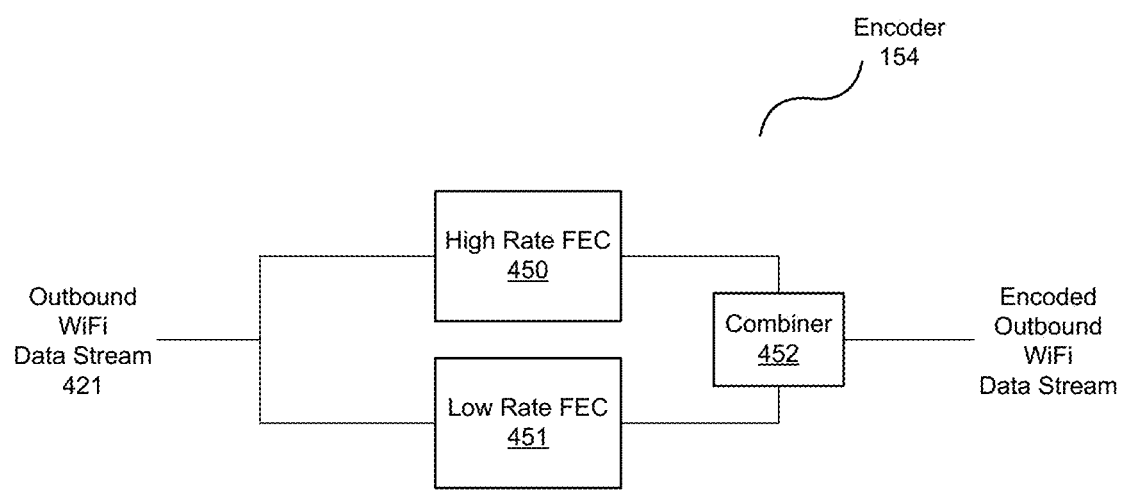

In another embodiment illustrated in FIG. 8, the encoder154 is configured with a high rate FEC 450 and a lower rate FEC 451, the outputs of which are combined with a combiner 452 to output the encoded WiFi datastream. For example, information bits of the WiFi datastream 421 may be split into two separate data streams. A higher rate, albeit less strong, coding scheme is applied to the information bits of the first data stream while a lower rate/stronger coding scheme is applied to the information bits of second data stream. The encoded bits of the higher rate stream are mapped onto the error free LTE gaps above while the encoded bits in the lower rate stream are mapped onto the windows of time where the LTE burst errors are likely to occur (e.g., as illustrated with window 422 in FIG. 7). The number of bits that go into each of these streams depends on the ratio of duration of the LTE gaps to the duration of the estimated burst error window of time 422, as well as the coding rates used for each information stream.

Figure 9A:
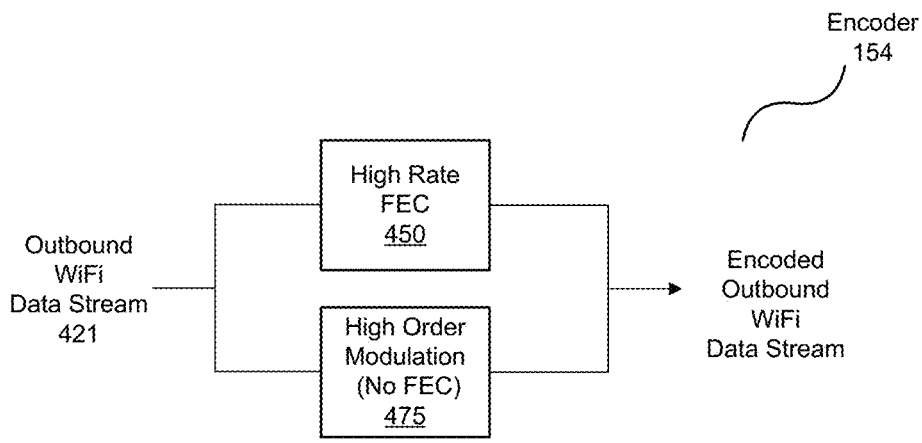
Figure 9B:
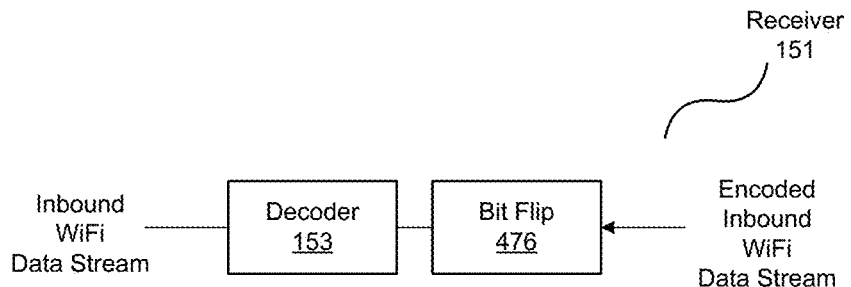

In another embodiment illustrated in FIGS. 9A and 9B, knowledge of the LTE reference symbols position in time is used to intentionally induce bit errors. In this embodiment, the encoder 154 in FIG. 9A again includes a higher rate FEC 450 for applying a coding scheme to the information bits to a first split of the outbound WiFi datastream 421. The second split of the outbound WiFi datastream 421 is simply modulated with a high order modulation (e.g., 64 state Quadrature Amplitude Modulation or higher). The two streams are then combined and output for reception by the receiver 151 in FIG. 9B. At the receiving end and with knowledge that bit errors will occur in the window 422 with a probability 1, the demodulated bits are flipped (element 476) such that logical "1s" become "0s" and vice versa before being fed into a channel decoder 153. In other words, when it is known that the bits will be in error, the demodulated bits are simply flipped to their correct states, thereby correcting the WiFi data stream 421.

Figure 10:
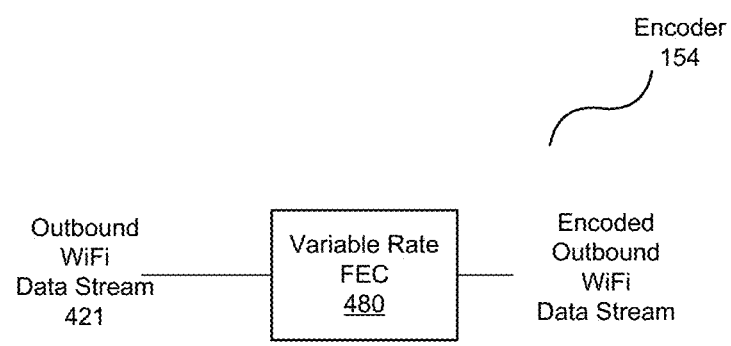

In another embodiment illustrated in FIG. 10, the encoder 154 is configured with a variable rate FEC 480 that is operable to change the FEC depending on the first errors of the LTE signaling. For example, when the encoder 154 expects the window 422 of burst errors, the encoder increases the amount of FEC to the WiFi datastream 421 and subsequently decreases the amount of FEC when that window 422 has passed.

Figure 11:
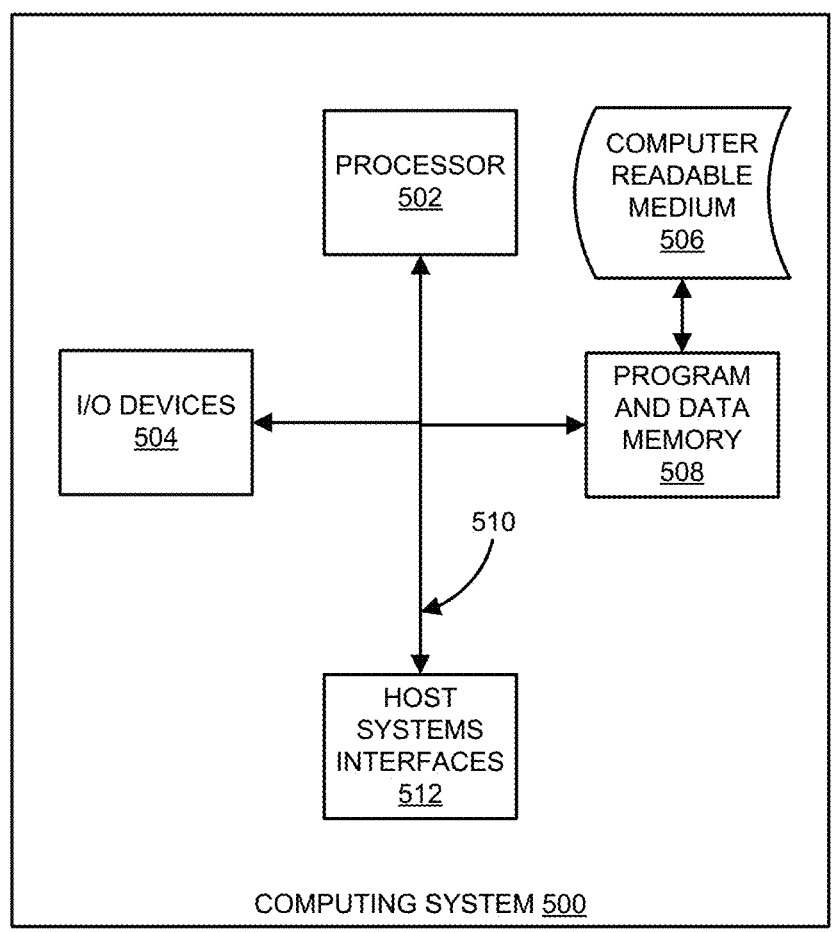
FIG. 11 is a block diagram of an exemplary computing system in which a computer readable medium provides instructions for performing methods herein.

The invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 11 illustrates a computing system 500 in which a computer readable medium 506 may provide instructions for performing any of the methods disclosed herein.

Furthermore, the invention can take the form of a computer program product accessible from the computer readable medium 506 providing program code for use by or in connection with a computer or any instruction execution system. For the purposes of this description, the computer readable medium 506 can be any apparatus that can tangibly store the program for use by or in connection with the instruction execution system, apparatus, or device, including the computer system 500.

The medium 506 can be any tangible electronic, magnetic, optical, electromagnetic, infrared, or semiconductor system (or apparatus or device). Examples of a computer readable medium 506 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 500, suitable for storing and/or executing program code, can include one or more processors 502 coupled directly or indirectly to memory 508 through a system bus 510. The memory 508 can include local memory employed during actual execution of the program code, bulk storage, and cache memories which provide temporary storage of at least some program code in order to reduce the number of times code is retrieved from bulk storage during execution. Input/output or I/O devices 504 (including but not limited to keyboards, displays, pointing devices, etc.) can be coupled to the system either directly or through intervening I/O controllers. Network adapters may also be coupled to the system to enable the computing system 500 to become coupled to other data processing systems, such as through host systems interfaces 512, or remote printers or storage devices through intervening private or public networks. Modems, cable modem and Ethernet cards are just a few of the currently available types of network adapters.

What is claimed is:

1. A method for enhancing operation of a wireless communication device operating in a conflicting signaling environment, comprising:
   detecting errors in first unlicensed communications between the wireless communication device and an external device;
   determining that the errors are periodic; and
   in response to determining that the errors are periodic, changing error correction implemented by the wireless communication device.

2. The method of claim 1, wherein changing error correction comprises adjusting error correction encoding by the wireless communication device according to a priori knowledge of a conflicting signaling source.

3. The method of claim 2, further comprising increasing error correction implemented by the wireless communication device in response to an expected impending error.

4. The method of claim 2, further comprising decreasing error correction implemented by the wireless communication device in response to no errors being expected.

5. The method of claim 1, wherein changing error correction comprises adding dummy bits to a forward error correction (FEC) generator matrix use by the wireless communication device to perform error correction.

6. The method of claim 1, wherein changing error correction comprises ignoring dummy bits in the first unlicensed communications.

7. The method of claim 1, wherein changing error correction comprises:
   splitting a first unlicensed communications data stream into a first data stream and a second data stream;
   encoding the first data stream at a first rate; and
   encoding the second data stream at a second rate that is lower than the first rate.

8. The method of claim 7, further comprising directing data bits into the first data stream during gaps in a conflicting signal.

9. The method of claim 1, wherein changing error correction comprises:
   splitting a first unlicensed communications data stream into a first data stream and a second data stream;
   encoding the first data; and
   modulating the second data stream.

10. The method of claim 1, wherein changing error correction comprises flipping logical state of bits received via the first unlicensed communications.

11. The method of claim 1, wherein changing error correction comprises increasing forward error correction rate during an expected error time window.

12. The method of claim 11, wherein changing error correction comprises decreasing forward error correction rate after the expected error time window.

13. The method of claim 1, wherein:
   the wireless communication device comprises a wireless access point (WAP); and
   the external device comprises a user equipment (UE).

14. The method of claim 1, wherein:
   the wireless communication device comprises a user equipment (UE); and
   the external device comprises a wireless access point (WAP).

15. A system for enhancing operation of a wireless communication device in a conflicting signaling environment, comprising:
   a computer readable medium; and
   a processor configured to execute instructions stored in the computer readable medium to:

detect errors in first unlicensed communications between the wireless communication device and an external device, determine that the errors are periodic, and in response to determining that the errors are periodic, change error correction implemented by the wireless communication device.

16. The system of claim 15, wherein the processor is further configured to execute instructions stored in the computer readable medium to change error correction by adjusting error correction encoding by the wireless communication device according to a priori knowledge of a conflicting signaling source.

17. The system of claim 15, wherein the processor is further configured to execute instructions stored in the computer readable medium to change error correction by adding dummy bits to a forward error correction (FEC) generator matrix used by the wireless communication device to perform error correction.

18. The system of claim 15, wherein the processor is further configured to execute instructions stored in the computer readable medium to change error correction by:

splitting a first unlicensed communications data stream into a first data stream and a second data stream;

encoding the first data stream at a first rate; and encoding the second data stream at a second rate that is lower than the first rate.

19. The system of claim 15, wherein the processor is further configured to execute instructions stored in the computer readable medium to change error correction by:

splitting a first unlicensed communications data stream into a first data stream and a second data stream;

encoding the first data; and modulating the second data stream.

20. The system of claim 15, wherein the processor is further configured to execute instructions stored in the computer readable medium to change error correction by flipping logical state of bits received via the first unlicensed communications.

21. The system of claim 15, wherein the system is part of one of a wireless access point (WAP) and a user equipment (UE).

* * * * *